United States Patent
Haga

(12) 
(10) Patent No.: US 11,094,601 B2
(45) Date of Patent: Aug. 17, 2021

(54) SEMICONDUCTOR ELEMENT AND METHOD FOR PRODUCING THE SAME

(71) Applicant: Rohm Co., Ltd., Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/670,413

(22) Filed: Oct. 31, 2019

(65) Prior Publication Data

US 2020/0144136 A1 May 7, 2020

(30) Foreign Application Priority Data

Nov. 6, 2018 (JP) .............. JP2018-208591

(51) Int. Cl.
*H01L 23/58* (2006.01)
*H01L 21/66* (2006.01)
*H01L 21/78* (2006.01)

(52) U.S. Cl.
CPC .............. *H01L 22/30* (2013.01); *H01L 21/78* (2013.01)

(58) Field of Classification Search
USPC .......................................... 257/48
See application file for complete search history.

(56) References Cited

U.S. PATENT DOCUMENTS

2011/0284841 A1* 11/2011 Kondou ................. H01L 22/32
257/48

FOREIGN PATENT DOCUMENTS

JP 9-22929 A 1/1997

* cited by examiner

*Primary Examiner* — Niki H Nguyen
(74) *Attorney, Agent, or Firm* — Hamre, Schumann, Mueller & Larson, P.C.

(57) ABSTRACT

A semiconductor element includes an element body and a test electrode. The element body has a principal surface facing in a thickness direction and a first side surface facing in a direction orthogonal to the principal surface and connected to the principal surface. The test electrode is disposed on the principal surface and is adjacent to the boundary between the principal surface and the first side surface. The element body is provided with a plurality of dents that straddle the boundary and are recessed from both the principal surface and the first side surface. The plurality of dents are arranged along the boundary.

18 Claims, 17 Drawing Sheets

SEMICONDUCTOR ELEMENT AND METHOD FOR PRODUCING THE SAME

FIELD

The present disclosure relates to a semiconductor element and a method for producing the semiconductor element.

BACKGROUND

In production of a semiconductor element, there are cases where a test electrode is provided in addition to an electrode to be connected to a bonding wire. The test electrode is provided for checking the electrical continuity of a circuit constructed on a semiconductor layer. JP H09(1997)-22929A discloses an example of a semiconductor element provided with a test electrode (a test pad in JP H09(1997)-22929A).

In a semiconductor device on which a semiconductor element is mounted, the test electrode is no longer necessary. Accordingly, in a semiconductor element singulation (dicing) step, the test electrode may be divided. In this case, if semiconductor element singulation is carried out using a commonly used dicing blade, there is a concern that the semiconductor element will be chipped as a result of dividing the test electrode.

Accordingly, in order to avoid the chipping of the semiconductor element caused by dividing the test electrode, laser irradiation may be used for semiconductor element singulation. However, there is a problem in that the thermal effect of laser irradiation is excessively concentrated on the semiconductor element, whereby the bending strength (transverse rupture strength) of the semiconductor element is reduced. A semiconductor element with reduced bending strength may break when mounting the semiconductor element on a lead frame or the like through die bonding during the production of a semiconductor device.

SUMMARY

In light of the foregoing, it is an object of the present disclosure to provide a semiconductor element that can suppress a reduction in bending strength while avoiding damage caused by dividing a test electrode(s), and a method for producing such a semiconductor element.

A first aspect of the present disclosure provides a semiconductor element including: an element body that has a principal surface facing in a thickness direction and a first side surface facing in a direction orthogonal to the principal surface and connected to the principal surface;

and a test electrode that is disposed on the principal surface and is adjacent to a boundary between the principal surface and the first side surface, where the element body is provided with a plurality of dents that straddle the boundary and are recessed from both the principal surface and the first side surface, and the plurality of dents are arranged along the boundary.

Preferably, the semiconductor element further includes a passivation film that covers the principal surface. The passivation film is provided with a plurality of recesses that are recessed inwardly from an outer edge of the passivation film and pass through the passivation film in the thickness direction, and as viewed along the thickness direction, the plurality of recesses and the plurality of dents overlap with each other in one-to-one correspondence, i.e., respectively.

Preferably, as viewed along the thickness direction, the plurality of recesses enclose the plurality of dents in one-to-one correspondence.

Preferably, the element body has a rear surface facing away from the principal surface and a second side surface facing in a direction orthogonal to the rear surface and connected to the rear surface, and as viewed along the thickness direction, the second side surface includes regions located outward of the first side surface.

Preferably, the element body has an intermediate surface connected to the first side surface and the second side surface, and as viewed along the thickness direction, the intermediate surface has a frame shape.

Preferably, the element body has an intermediate surface connected to the first side surface and the second side surface, and as viewed along the thickness direction, the intermediate surface includes a pair of regions that are spaced apart from each other in a direction orthogonal to the thickness direction.

Preferably, the intermediate surface is a rough surface.

Preferably, the intermediate surface is recessed inwardly of the semiconductor element.

Preferably, a cross-sectional area of each of the dents along directions orthogonal to the thickness direction decreases gradually from the principal surface toward the rear surface.

Preferably, each of the dents has a fragment of the element body adhering thereto.

Preferably, the test electrode has an end surface facing in a direction orthogonal to the thickness direction and also facing toward the outside of the element body, and the end surface is exposed.

Preferably, the element body includes a semiconductor substrate that has the rear surface and a functional layer that has the principal surface and is laminated on the semiconductor substrate, the test electrode is electrically connected to the function layer, and the semiconductor substrate and the functional layer each have a portion of the first side surface.

Preferably, the plurality of dents extend to the inside of the semiconductor substrate.

Preferably, the semiconductor element further includes: a plurality of electrodes that are disposed on the principal surface, surrounded by the passivation film, and electrically connected to the functional layer; and a surface protective film that covers the passivation film and is located about the plurality of electrodes.

A second aspect of the present disclosure provides a method for producing a semiconductor element, including: a step of forming a test electrode on an element continuous body that has a principal surface facing in a thickness direction; a step of forming a groove that is recessed from the principal surface in the thickness direction and extends in a first direction orthogonal to the thickness direction in the element continuous body while dividing the test electrode; and a step of cutting the element continuous body along the first direction by inserting a dicing blade in the thickness direction into the groove. The step of forming the groove includes a first removal step of irradiating each of a plurality of first circular regions and each of a plurality of second circular regions with a first laser to remove portions of the element continuous body and the test electrodes falling within the first circular regions and the second circular regions. The first circular regions are arranged at predetermined intervals in the first direction and the second circular regions are arranged at the predetermined intervals in the first direction and spaced apart from the first circular regions in a second direction orthogonal to both the thickness direction and the first direction as viewed along the thickness direction. The step of forming the groove also includes a second removal step of irradiating a band-shaped region with a second laser to remove portions of the element continuous body and the test electrodes falling within the band-shaped region. The band-shaped region extends in the first direction and are continuous with both the first circular regions and the second circular regions as viewed along the thickness direction.

Preferably, a dimension of irradiation with the first laser in the second direction is smaller than a dimension of irradiation with the second laser in the second direction. Preferably, an output of the first laser is smaller than an output of the second laser.

Preferably, the plurality of first circular regions are all equal in size, and the plurality of second circular regions are all equal in size.

The semiconductor element and the production method thereof according to the present disclosure enable suppressing a reduction in bending strength while avoiding damage caused by dividing a test electrode.

Other characteristics and advantages of the present disclosure will become more apparent by the following detailed description with reference to the accompanying drawings.

EMBODIMENTS

Figure 1:
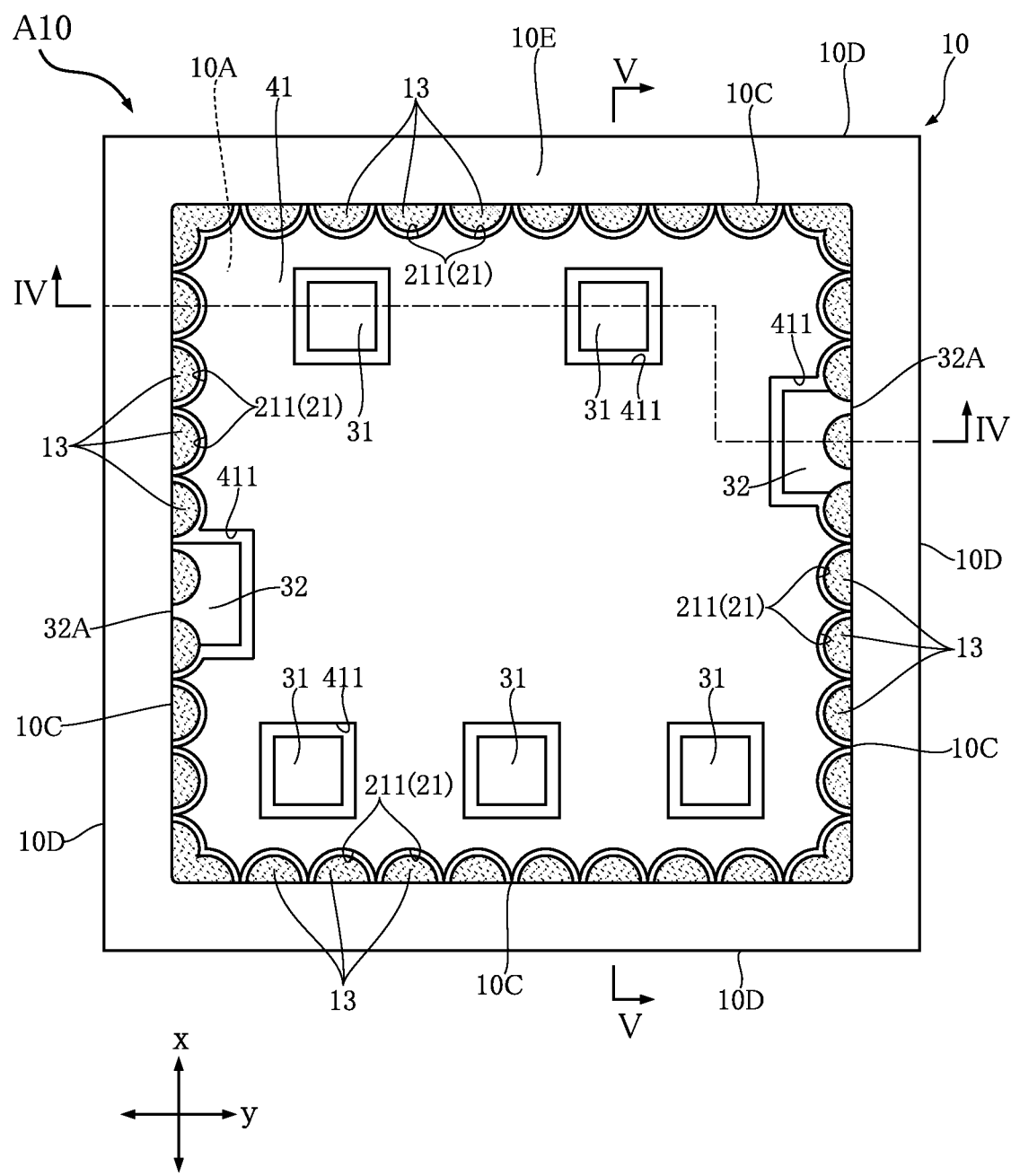
FIG. 1 is a plan view of a semiconductor element according to a first embodiment of the present disclosure.
Figure 2:
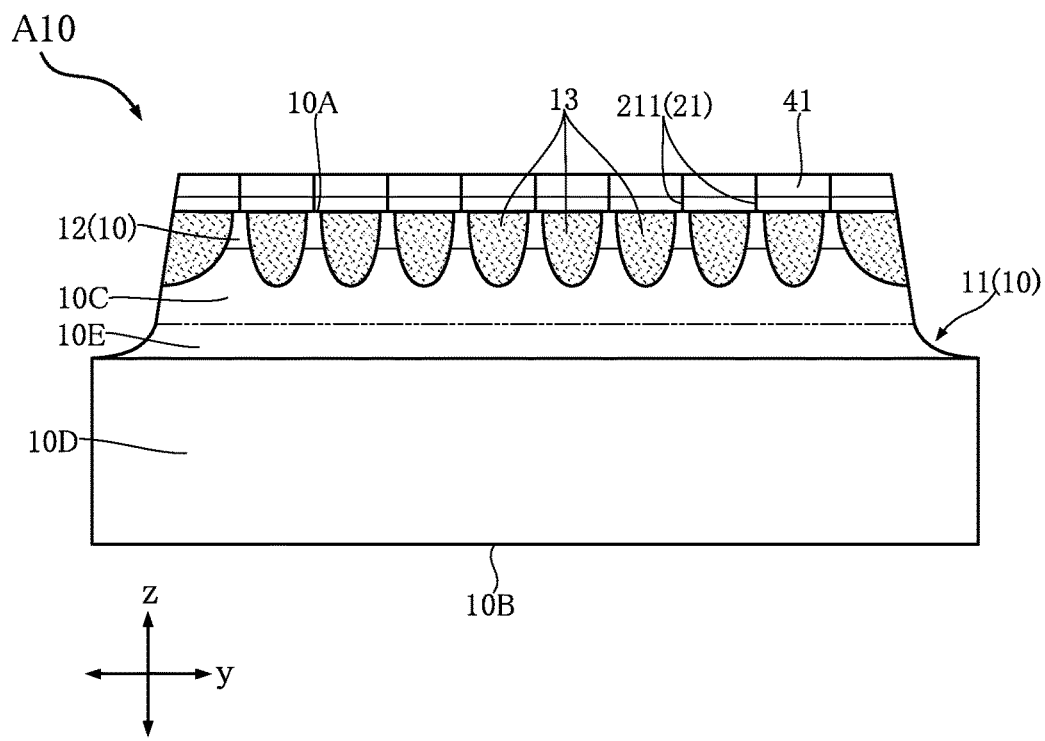
FIG. 2 is a front view of the semiconductor element shown in FIG. 1.
Figure 3:
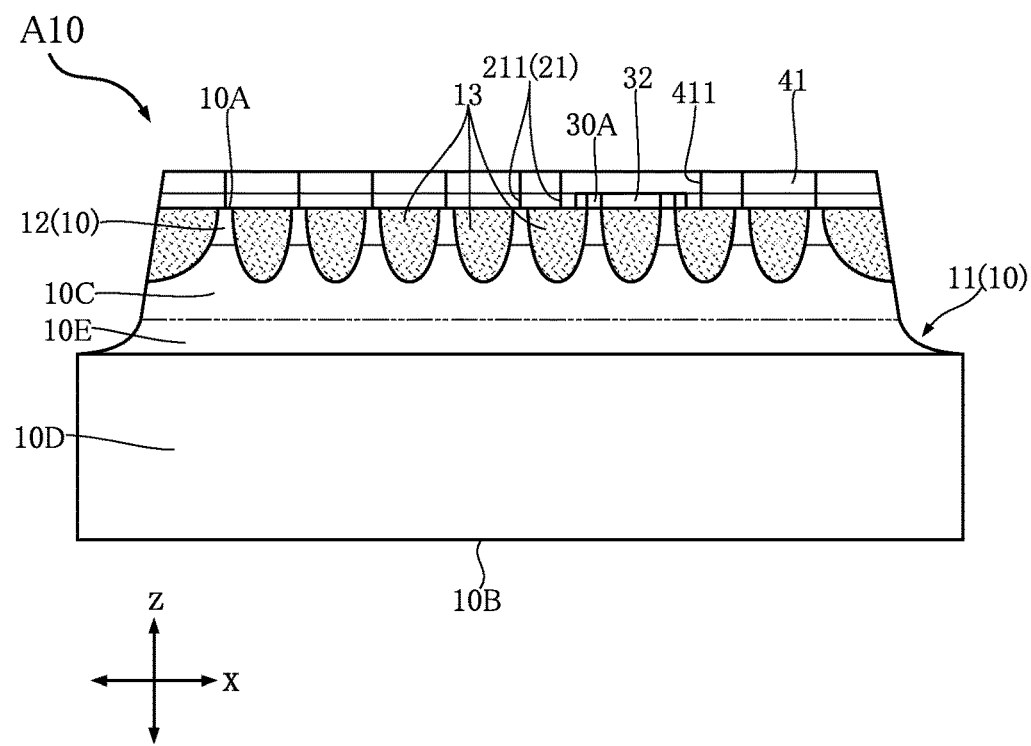
FIG. 3 is a right side view of the semiconductor element shown in FIG. 1.

Embodiments of the present disclosure will be described with reference to the accompanying drawings.

A semiconductor element A10 according to the first embodiment of the present disclosure will be described with reference to FIGS. 1 to 10. The semiconductor element A10 shown in FIGS. 1 to 10 includes an element body 10, a passivation film 21, a plurality of electrodes 31, a plurality of test electrodes 32, and a surface protective film 41.

In the description of the semiconductor element A10, the thickness direction z of the element body 10 may be referred to as a "thickness direction z" for convenience of explanation. A direction orthogonal to the thickness direction z may be referred to as a "first direction x". The direction orthogonal to both the thickness direction z and the first direction x may be referred to as a "second direction y".

Figure 8:
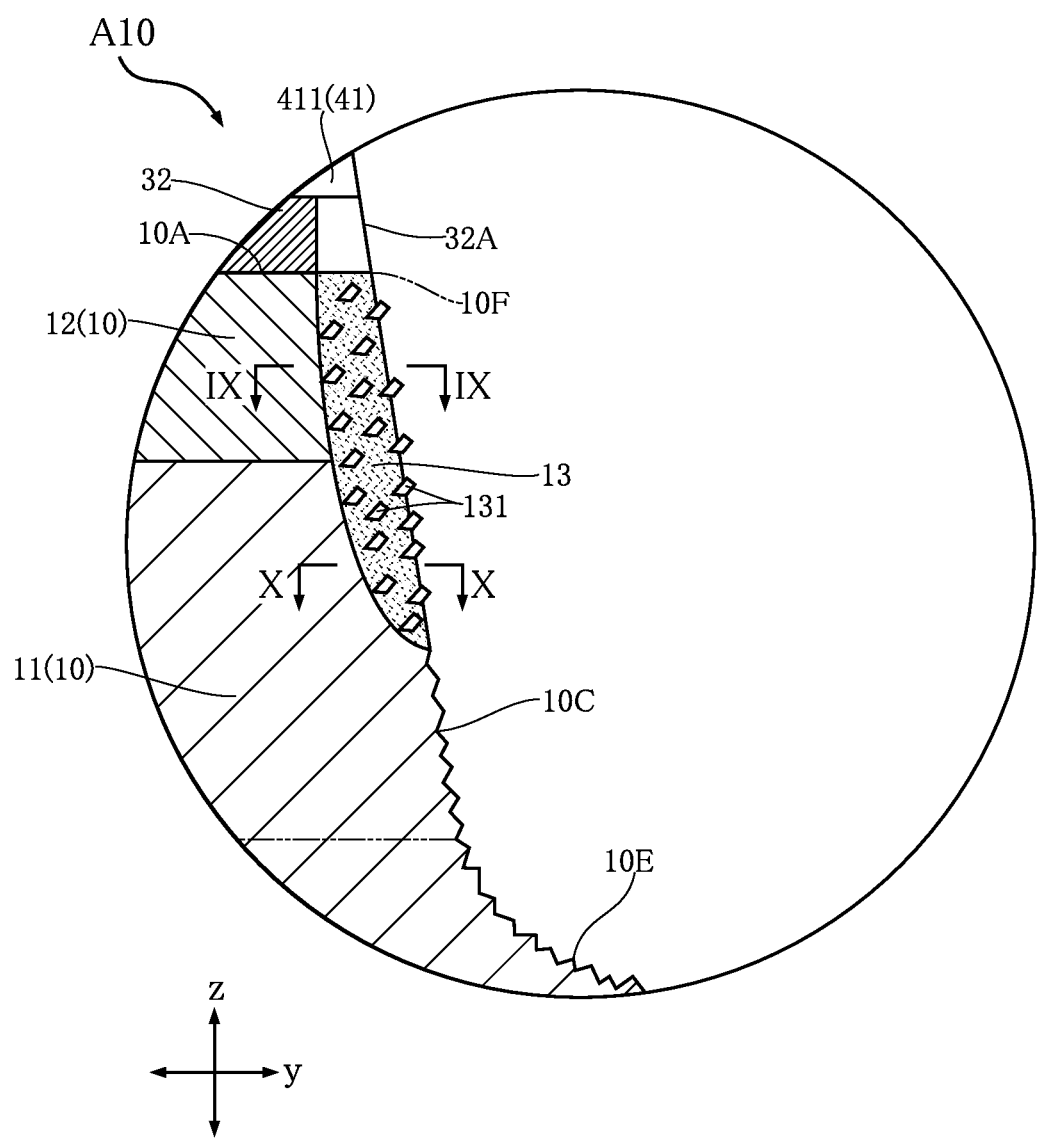
FIG. 8 is a cross-sectional view taken along line VIII-VIII in FIG. 7.

As shown in FIG. 1, the element body 10 is rectangular as viewed along or in the thickness direction z. As shown in FIGS. 2 to 5, the element body 10 has a principal surface 10A, a rear surface 10B, a first side surface 10C, a second side surface 10D, and an intermediate surface 10E. The principal surface 10A faces in the thickness direction z. The rear surface 10B faces away from the principal surface 10A. The first side surface 10C faces in directions (the first direction x and the second direction y) orthogonal to the thickness direction z, and is connected to the principal surface 10A. In the example illustrated using the semiconductor element A10, the first side surface 10C includes a pair of regions facing in the first direction x and a pair of regions facing in the second direction y. As shown in FIG. 8, the first side surface 10C is a rough surface. The second side surface 10D faces in the directions orthogonal to the thickness direction z, and is connected to the rear surface 10B. The second side surface 10D includes a pair of regions facing in the first direction x and a pair of regions facing in the second direction y.

As shown in FIGS. 2 to 5, the intermediate surface 10E is connected to the first side surface 10C and the second side surface 10D. As shown in FIG. 1, in the semiconductor element A10, as viewed along the thickness direction z, the intermediate surface 10E has a frame shape surrounding the principal surface 10A and the first side surface 10C. With this configuration, as viewed along the thickness direction z, the four regions included in the second side surface 10D are all located outward of the first side surface 10C. As shown in FIG. 8, the intermediate surface 10E is a rough surface. The intermediate surface 10E is recessed inwardly of the element body 10.

Figure 4:
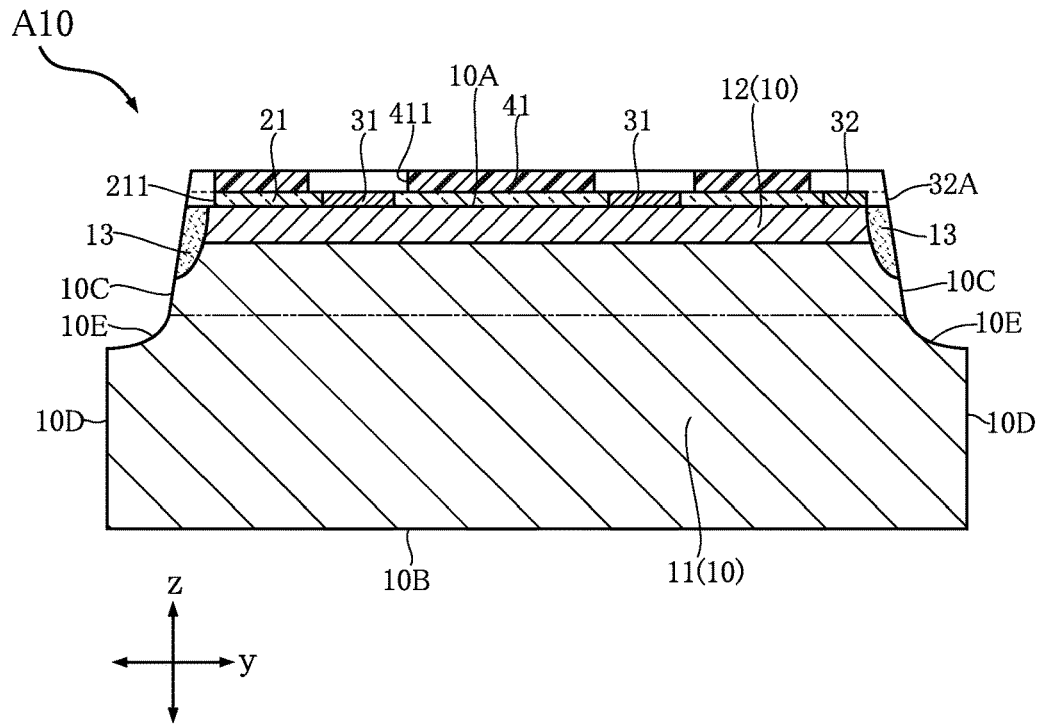
FIG. 4 is a cross-sectional view taken along line IV-IV in FIG. 1.
Figure 5:
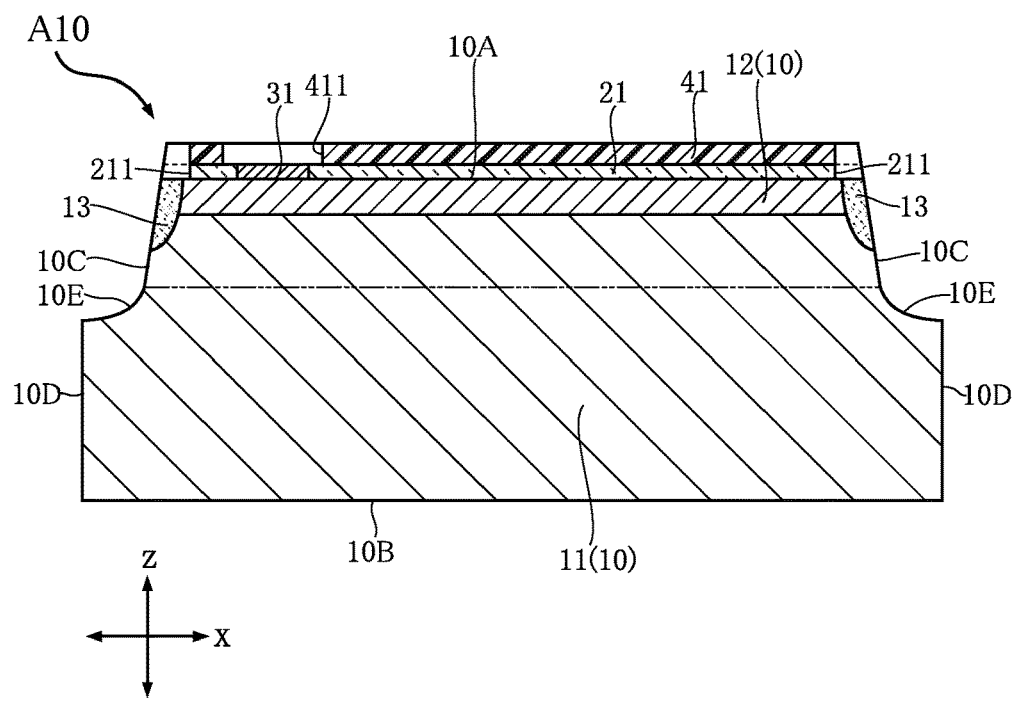
FIG. 5 is a cross-sectional view taken along line V-V in FIG. 1.

As shown in FIGS. 4 and 5, the element body 10 includes a semiconductor substrate 11 and a functional layer 12. The semiconductor substrate 11 supports the functional layer 12. The material forming the semiconductor substrate 11 is non-doped silicon (Si), for example. The semiconductor substrate 11 has the rear surface 10B, the second side surface 10D, the intermediate surface 10E, and a portion of the first side surface 10C.

Figure 6:
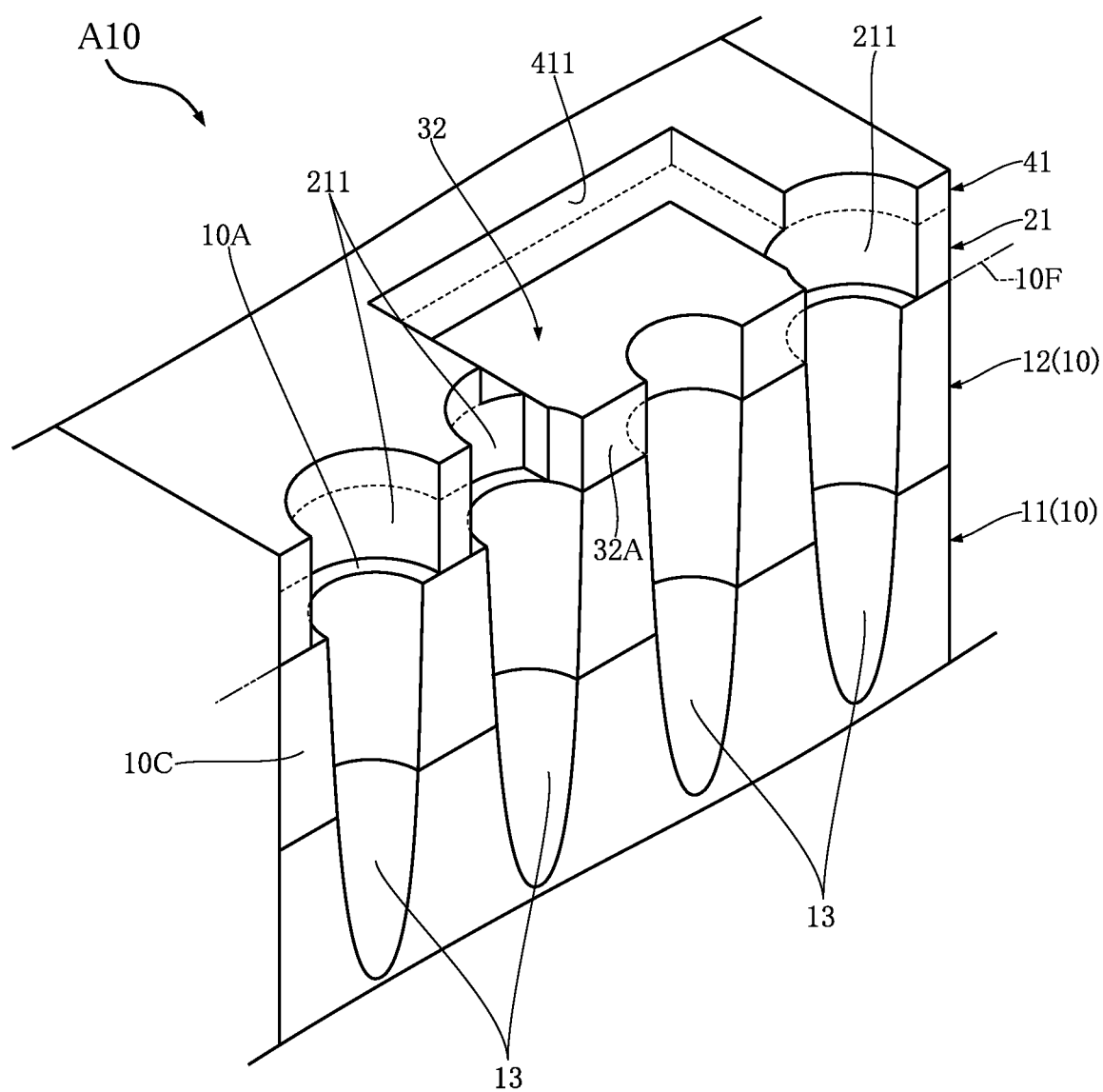
FIG. 6 is an enlarged partial perspective view of the semiconductor element shown in FIG. 1.

As shown in FIGS. 4 and 5, the functional layer 12 is laminated on the semiconductor substrate 11. The functional layer 12 includes a semiconductor layer, an interlayer insulating film, and a wiring layer (none of which are shown). The semiconductor layer is in contact with the semiconductor substrate 11. On the semiconductor layer, a circuit including, e.g., a plurality of transistors formed of a p-type semiconductor and an n-type semiconductor is constructed. The semiconductor layer is formed through epitaxial growth. The interlayer insulating film is laminated on the semiconductor layer. At least one of a silicon oxide ($SiO_2$) film and a silicon nitride ($Si_3N_4$) film constitutes the interlayer insulating film. The interlayer insulating film is formed through plasma CVD (Chemical Vapor Deposition) or the like. The wiring layer is disposed onto the semiconductor layer so as to have portions that pass through the interlayer insulating film in the thickness direction z. The wiring layer is electrically connected to the semiconductor layer. The material forming the wiring layer is, for example, one or more metals selected from a metal material group including aluminum (Al), copper (Cu), titanium (Ti), tungsten (W), and tantalum (Ta). As shown in FIG. 6, the functional layer 12 includes the principal surface 10A and a portion of the first side surface 10C.

As shown in FIGS. 4 and 5, the passivation film 21 covers the principal surface 10A of the element body 10. The passivation film 21 is electrically insulating. The passivation film 21 is a silicon nitride film, for example.

As shown in FIGS. 1 to 8, the element body 10 is provided with a plurality of dents 13. The dents 13 straddle a boundary 10F between the principal surface 10A and the first side surface 10C of the element body 10. The dents 13 are recessed from both the principal surface 10A and the first side surface 10C. The dents 13 are arranged along the boundary 10F. In the semiconductor element A10, the dents 13 are arranged along the four sides of the boundary 10F. Thus, as viewed along the thickness direction z, the dents 13 are arranged in a frame shape surrounding the principal surface 10A.

Figure 9:
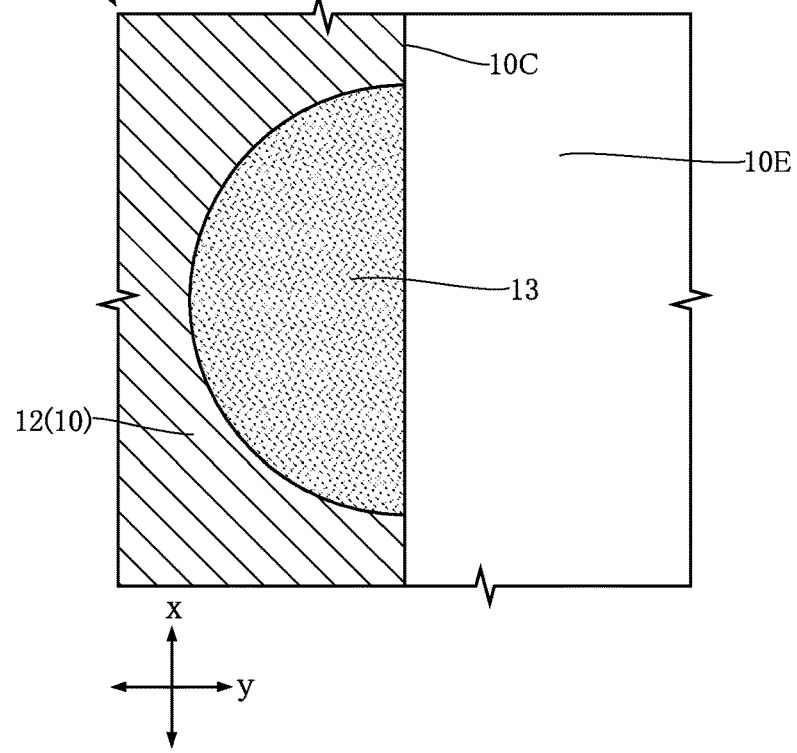
FIG. 9 is a cross-sectional view taken along line IX-IX in FIG. 8.
Figure 10:
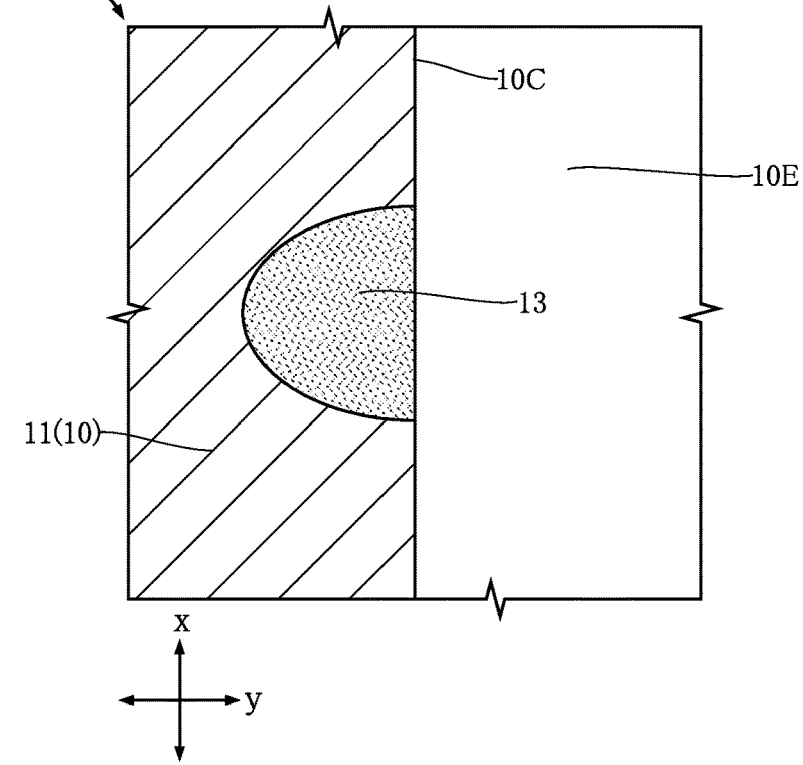
FIG. 10 is a cross-sectional view taken along line X-X in FIG. 8.

As shown in FIGS. 4 to 6, the dents 13 pass through the functional layer 12 in the thickness direction z and extend to the inside of the semiconductor substrate 11. As shown in FIG. 8, each of the dents 13 has fragments 131 of the element body 10 adhering thereto. The main component of the fragments 131 is a semiconductor material such as silicon. As shown in FIGS. 9 and 10, the cross-sectional area of each dent 13 in a plane orthogonal to the thickness direction z gradually decreases from the principal surface 10A toward the rear surface 10B of the element body 10.

As shown in FIGS. 1 to 7, the passivation film 21 is provided with a plurality of recesses 211. The recesses 211 are recessed inwardly from the outer edge of the passivation film 21. The recesses 211 pass through the passivation film in the thickness direction z. As viewed along the thickness direction z, the recesses 211 and the dents 13 overlap with each other in one-to-one correspondence, in other words, respectively. In the semiconductor element A10, as viewed along the thickness direction z, the recesses 211 enclose the dents 13 in one-to-one correspondence.

As shown in FIGS. 4 and 5, the plurality of electrodes 31 are disposed on the principal surface 10A of the element body 10. The electrodes 31 are surrounded by the passivation film 21. The electrodes 31 are electrically connected to the functional layer 12. The material forming the electrodes 31 contains aluminum, for example. In a package provided with the semiconductor element A10, bonding wires are connected to the electrodes 31.

Figure 7:
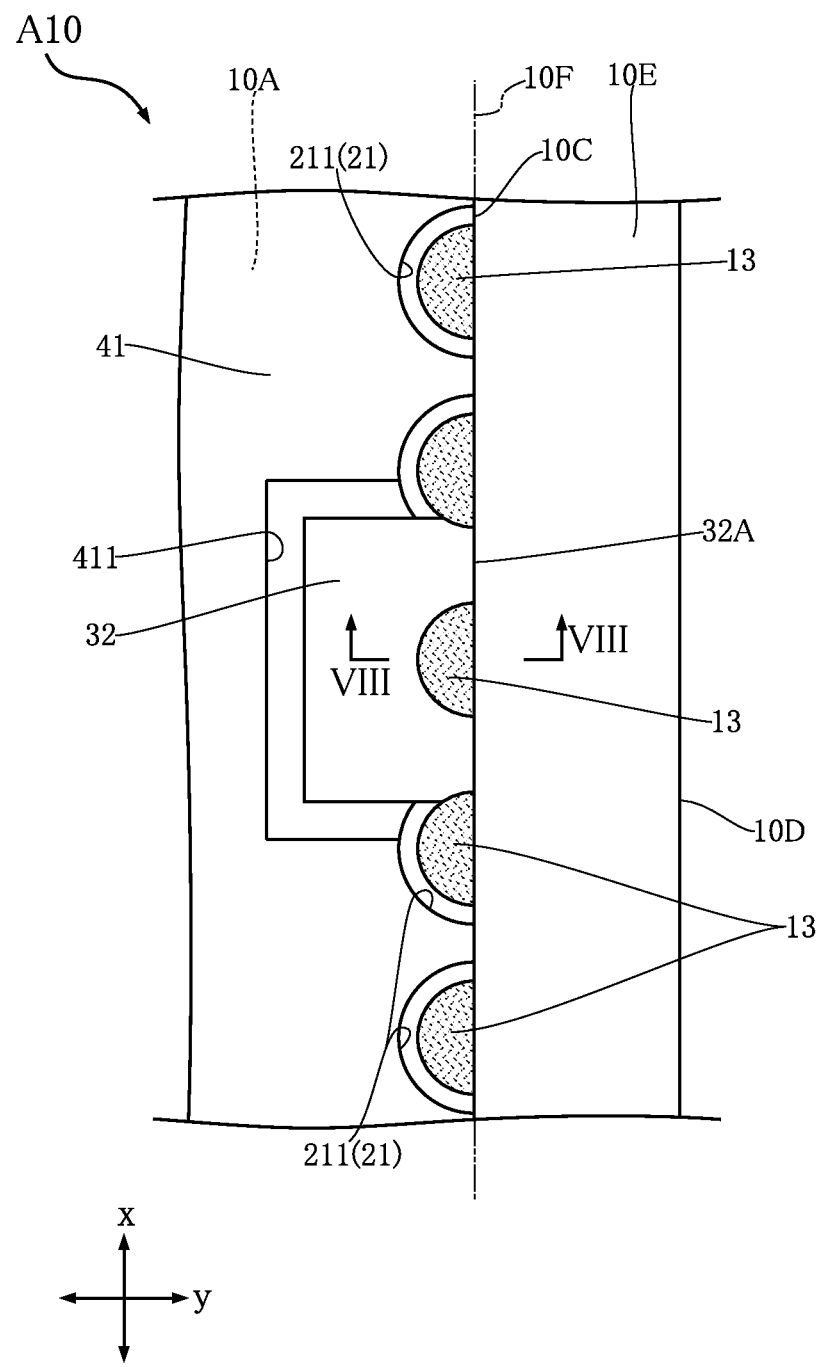
FIG. 7 is an enlarged partial plan view of the semiconductor element shown in FIG. 1.

As shown in FIGS. 4 and 5, the plurality of test electrodes 32 are disposed on the principal surface 10A of the element body 10. As shown in FIGS. 6 and 7, the test electrodes 32 are adjacent to the boundary 10F between the principal surface 10A and the first side surface 10C of the element body 10. The test electrodes 32 are electrically connected to the functional layer 12. The material forming the test electrodes 32 contains aluminum, for example. The test electrodes 32 are used to check the electrical continuity of the functional layer 12 during the production of the semiconductor element A10.

As shown in FIGS. 6 to 8, each of the test electrodes 32 has an end surface 32A facing in a direction orthogonal to the thickness direction z (the first direction x in the semiconductor element A10) and also facing toward the outside of the element body 10. As viewed along the thickness direction z, the end surface 32A is located at the boundary 10F between the principal surface 10A and the first side surface 10C of the element body 10. The end surface 32A is exposed. A pair of dents 13 are located at two ends of the end surface 32A in the direction orthogonal to the thickness direction z. Apart from their end surfaces 32A, the test electrodes 32 are surrounded by the passivation film 21 and the dents 13.

As shown in FIGS. 4 and 5, the surface protective film 41 covers the passivation film 21. The surface protective film 41 is located about or around the electrodes 31 and the test electrodes 32. The surface protective film 41 is electrically insulating. The material forming the surface protective film 41 contains polyimide. The surface protective film 41 is provided with a plurality of openings 411. Either an electrode 31 or a test electrode 32 is exposed from each of the openings 411.

Next, a method for producing the semiconductor element A10 will be described with reference to FIGS. 11 to 18. Of these drawings, FIGS. 11 to 13 and 18 are cross-sectional views taken along the same line as the cross-sectional view of FIG. 4.

Figure 11:
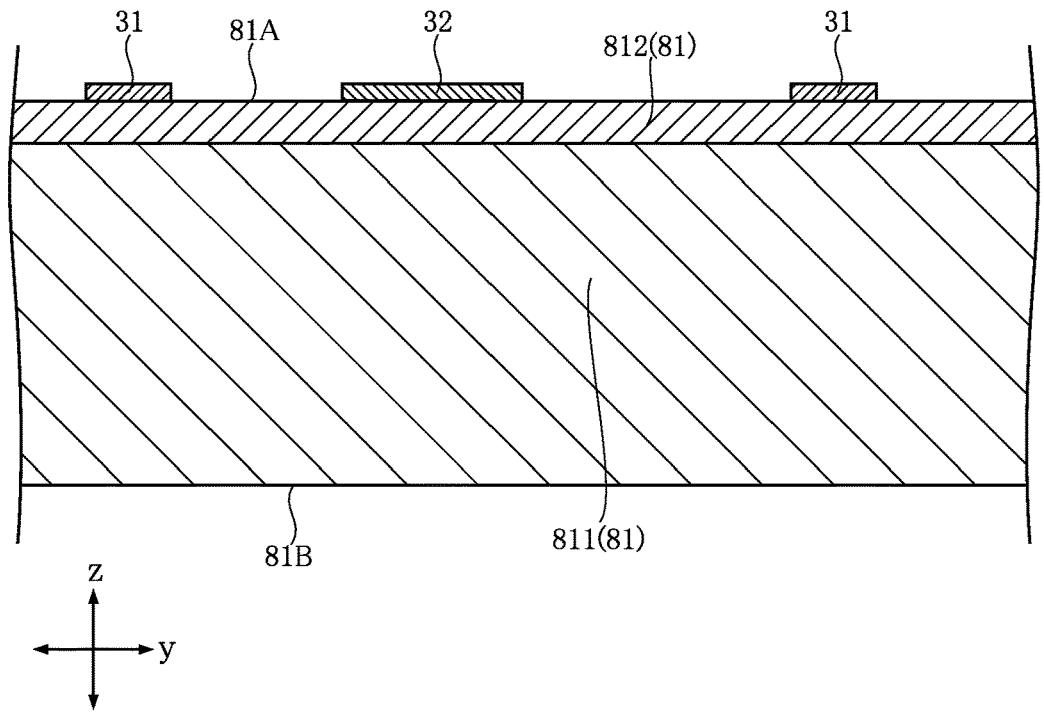
FIG. 11 is a cross-sectional view for illustrating a production process of the semiconductor element shown in FIG. 1.

First, as shown in FIG. 11, a plurality of electrodes 31 and a plurality of test electrodes 32 are formed on an element continuous body 81. The element continuous body 81 is a structure in which element bodies 10 of semiconductor elements A10 are provided continuously in a direction orthogonal to the thickness direction z. The element continuous body 81 includes a semiconductor substrate 811 and a functional layer 812. The semiconductor substrate 811 is a silicon wafer, for example. The semiconductor substrate 811 corresponds to the semiconductor substrate 11 of the semiconductor element A10. The functional layer 812 is laminated on the semiconductor substrate 811. The functional layer 812 corresponds to the functional layer 12 of the semiconductor element A10. The element continuous body 81 has a principal surface 81A and a rear surface 81B that face away from each other in the thickness direction z. The semiconductor substrate 811 has the rear surface 81B. The functional layer 812 has the principal surface 81A. The electrodes 31 and the test electrodes 32 are formed on the principal surface 81A through electroplating.

Figure 12:
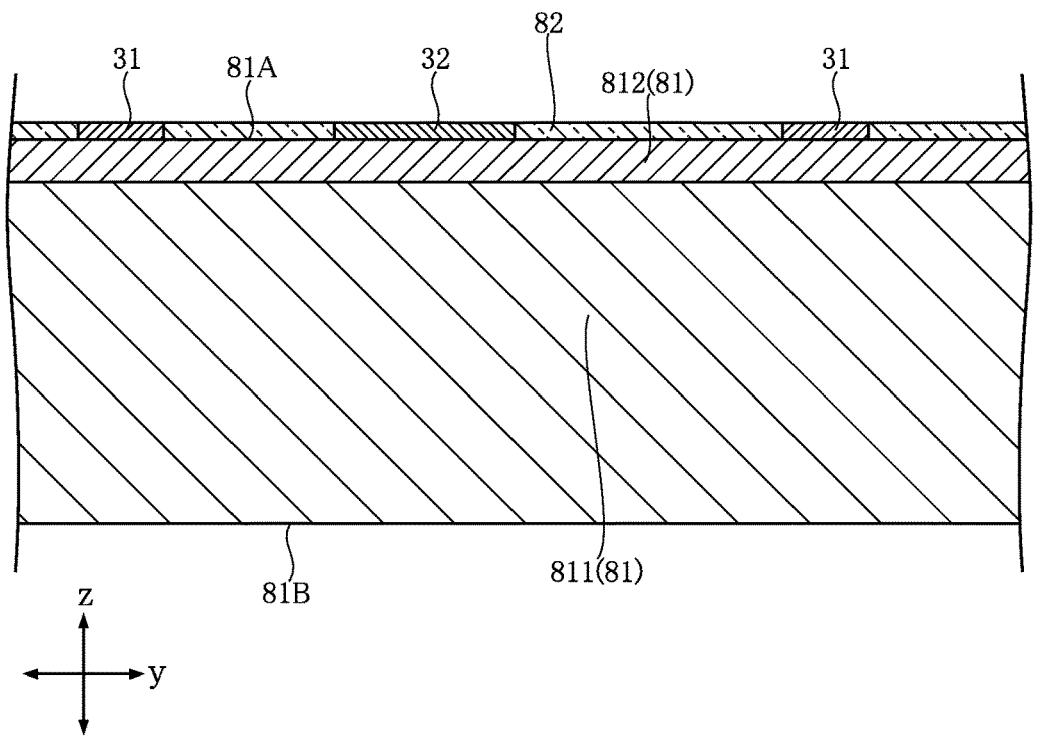
FIG. 12 is a cross-sectional view for illustrating the production process of the semiconductor element shown in FIG. 1.

Next, as shown in FIG. 12, a passivation film 82 that covers the principal surface 81A of the element continuous body 81 is formed. The passivation film 82 corresponds to the passivation film 21 of the semiconductor element A10. The passivation film 82 is formed such that surfaces of the electrodes 31 and the test electrodes 32 are exposed therefrom. The passivation film 82 is formed through plasma CVD, for example.

Figure 13:
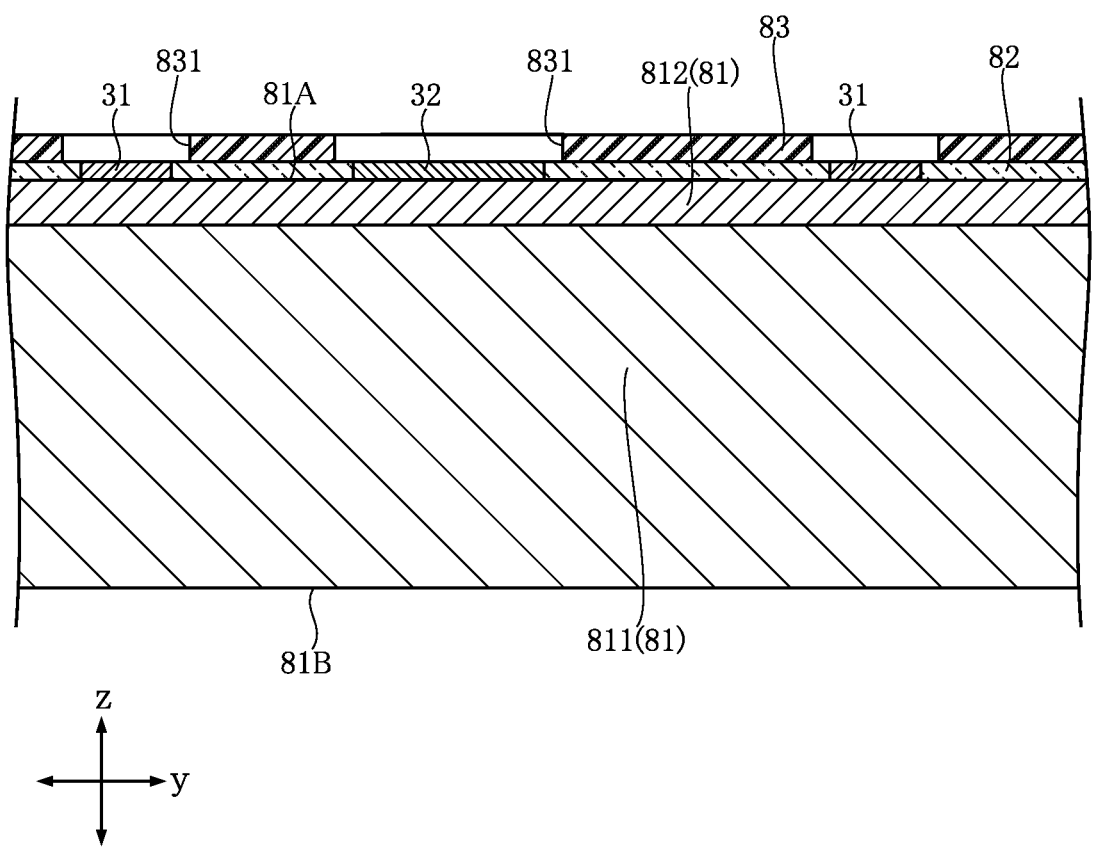
FIG. 13 is a cross-sectional view for illustrating the production process of the semiconductor element shown in FIG. 1.

Next, as shown in FIG. 13, a surface protective film that covers the passivation film 82 is formed. The surface protective film 83 corresponds to the surface protective film 41 of the semiconductor element A10. The surface protective film 83 is formed through coating using a spin coater, for example. At this time, a plurality of openings 831 are formed in the surface protective film 83 such that they pass through the surface protective film 83 in the thickness direction z. Either an electrode 31 or a test electrode 32 is exposed from each of the openings 831.

Next, as shown in FIGS. 14 to 17, a plurality of grooves 86 recessed from the principal surface 81A of the element continuous body 81 in the thickness direction z are formed in the element continuous body 81 while dividing the test electrodes 32. The grooves 86 extend in directions orthogonal to the thickness direction z. In the production of the semiconductor element A10, the grooves 86 are formed such that they extend in the first direction x and the second direction y, respectively. Accordingly, as viewed along the thickness direction z, the grooves 86 are formed in a grid pattern along the first direction x and the second direction y. In the description of the method for producing the semiconductor element A10, the method for forming the grooves 86 that extend in the first direction x will be described by way of example.

The step of forming the grooves 86 includes a first removal step and a second removal step. The grooves 86 are formed by performing the first removal step and then performing the second removal step.

The first removal step used to form the grooves 86 will be described with reference to FIGS. 14 and 15. As shown in FIG. 15, in the first removal step, first circular regions 84A and second circular regions 84B are each irradiated with a first laser 84. As a result, as viewed along the thickness direction z, portions of the element continuous body 81, passivation film 82, and surface protective film 83 falling within the first circular regions 84A and the second circular regions 84B are removed. As a result of removing the portions of the element continuous body 81, a plurality of dents 813 recessed from the principal surface 81A in the thickness direction z are formed in the element continuous body 81. As a result of removing the portions of the passivation film 82, a plurality of penetrating portions 821 that enclose the plurality of dents 813 in one-to-one correspondence as viewed along the thickness direction z are formed in the passivation film 82. Furthermore, in addition to removing these portions, portions of the test electrodes 32 falling within the first circular regions 84A and the second circular regions 84B as viewed along the thickness direction z are also removed.

Figure 14:
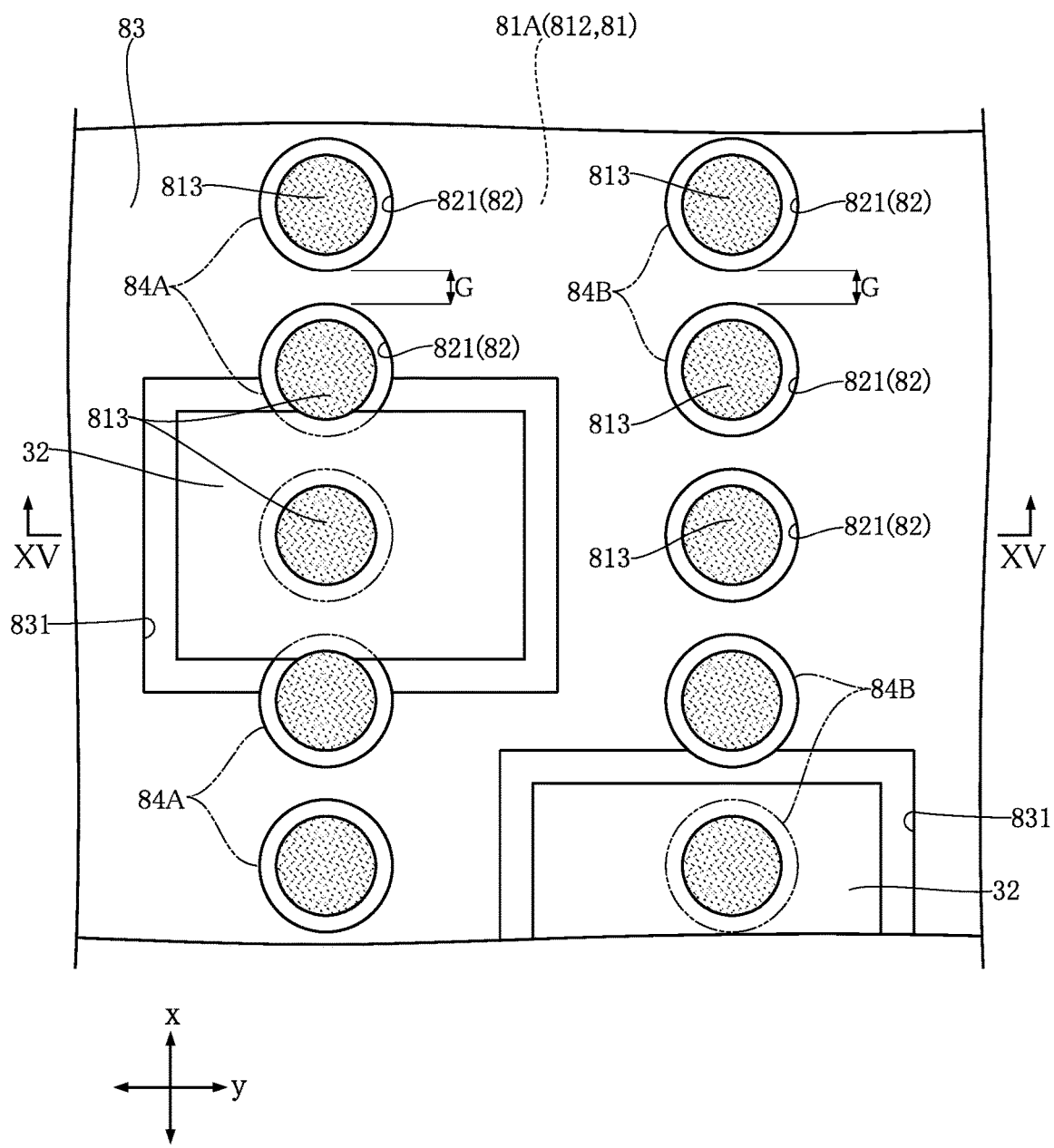
FIG. 14 is an enlarged partial plan view for illustrating the production process of the semiconductor element shown in FIG. 1.
Figure 15:
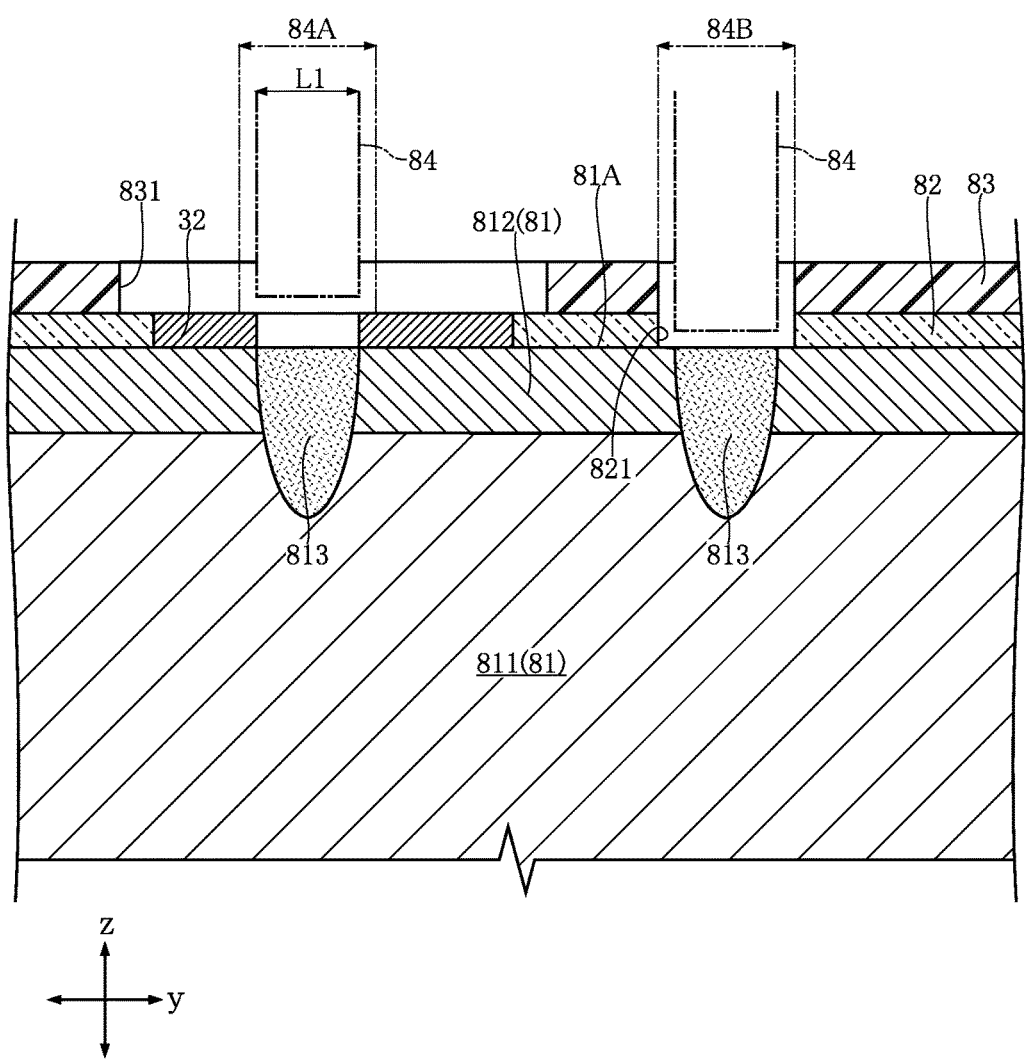
FIG. 15 is a cross-sectional view taken along line XV-XV in FIG. 14.

As shown in FIG. 14, as viewed along the thickness direction z, the first circular regions 84A are disposed at predetermined intervals G in the first direction. As viewed along the thickness direction z, the second circular regions 84B are disposed at the predetermined intervals G in the first direction. The second circular regions 84B are spaced apart from the first circular regions 84A in the second direction y. The center positions of the second circular regions 84B in the first direction x are in alignment with the center positions of the first circular regions 84A in the first direction x. The first circular regions 84A are all equal in size, and the second circular regions 84B are all equal in size. The first circular regions 84A and the second circular regions 84B each have a diameter of 8.75 μm, for example.

At the time of irradiation with the first laser 84, a metal mask (not shown) is placed on the surface protective film 83. The metal mask has a pair of circular openings that pass through the metal mask in the thickness direction z and are spaced apart from each other in the second direction y. One of the circular openings corresponds to the first circular region 84A, and the other circular opening corresponds to the second circular region 84B. In the first removal step, the pair of circular openings are each irradiated with the first laser 84. Thereafter, the metal mask is moved in the first direction x by a distance corresponding to the interval G. By repeating the above-described operation, the first circular regions 84A and the second circular regions 84B are each irradiated with the first laser 84. As shown in FIG. 15, the dimension L1 of irradiation with the first laser 84 in the second direction y is slightly smaller (about 7 μm) than the diameters of the first circular regions 84A and the second circular regions 84B. The output of the first laser 84 is 1.8 W, for example.

In the first removal step, the first laser 84 passes through the passivation film 82 and the surface protective film 83 and melts the element continuous body 81. As a result, the plurality of dents 813 are formed in the element continuous body 81. At this time, the vapor pressure of the melted element continuous body 81 rises, thereby causing portions of the passivation film 82 and surface protective film 83 overlapping with the dents 813 as viewed along the thickness direction z to burst. As a result, the plurality of penetrating portions 821 are formed in the passivation film 82. The fragments 131 of the element body 10 shown in FIG. 8 are recrystallized products obtained after the melted element continuous body 81 is cooled.

Figure 16:
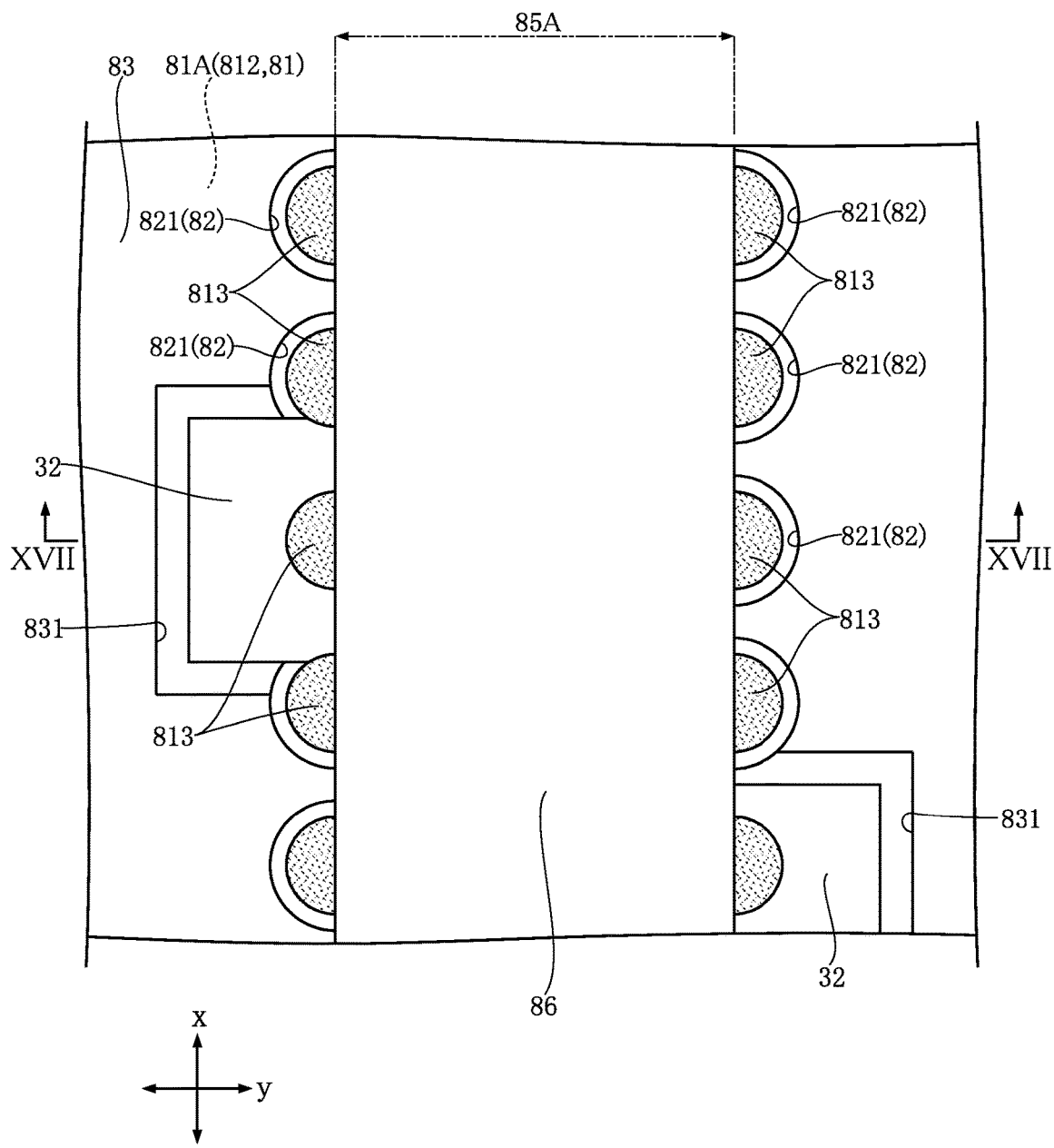
FIG. 16 is an enlarged partial plan view for illustrating the production process of the semiconductor element shown in FIG. 1.
Figure 17:
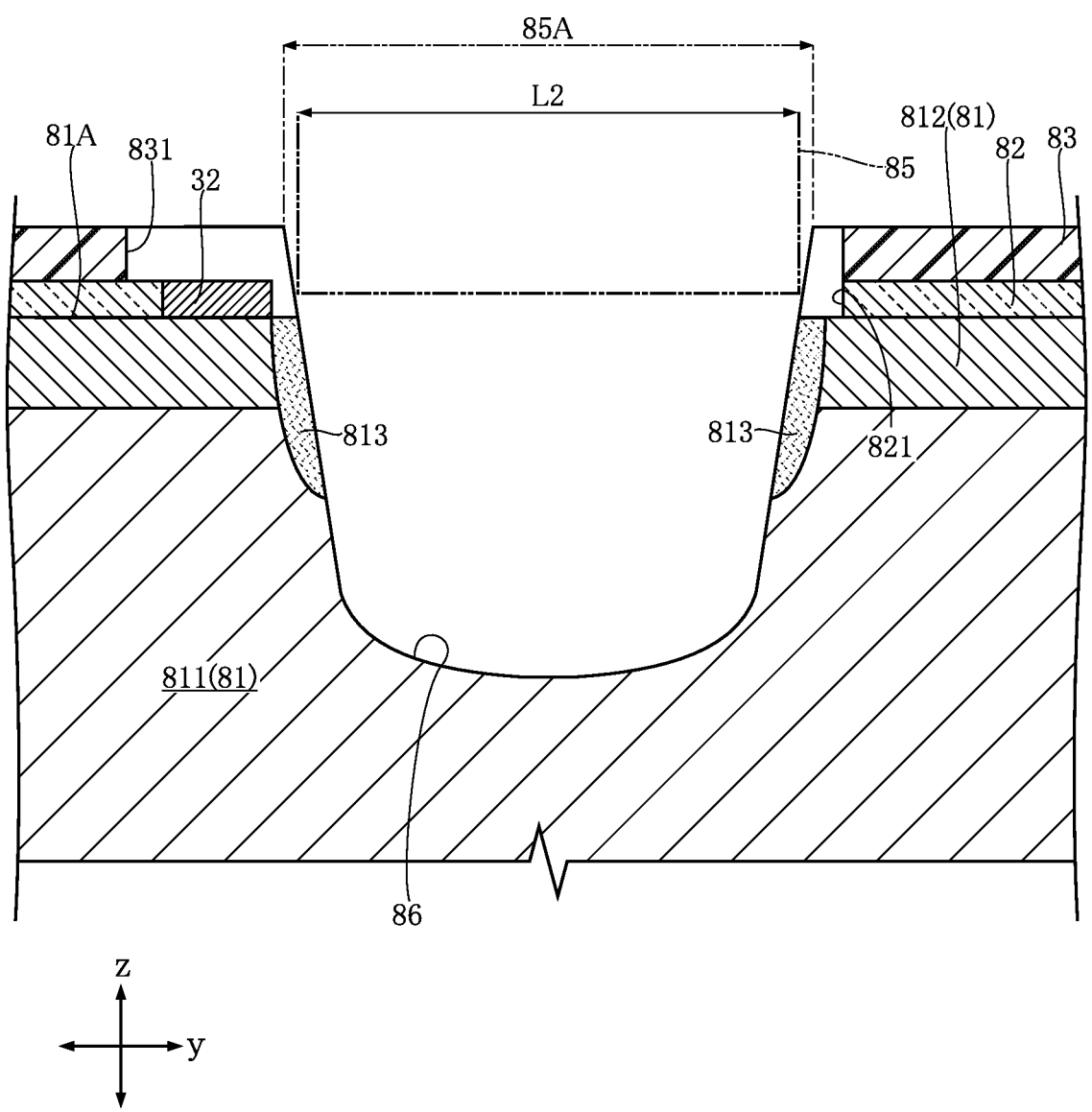
FIG. 17 is a cross-sectional view taken along line XVII-XVII in FIG. 16.

With reference to FIGS. 16 and 17, the second removal step used to form the grooves 86 will be described. As shown in FIG. 17, in the second removal step, a band-shaped region 85A is irradiated with a second laser 85. As a result, as viewed along the thickness direction z, portions of the element continuous body 81, passivation film 82, and surface protective film 83 falling within the band-shaped region 85A are removed. At this time, as viewed along the thickness direction z, portions of the dents 813 falling within the band-shaped region 85A are removed. Furthermore, in addition to the removal of these portions, portions of the test electrodes 32 falling within the band-shaped region 85A as viewed along the thickness direction z are also removed.

As shown in FIG. 16, the band-shaped region 85A extends in the first direction x as viewed along the thickness direction z. The band-shaped region 85A is continuous with both the first circular regions 84A and the second circular regions 84B as viewed along the thickness direction z. The width of the band-shaped region 85A (the dimension in the second direction y) is 50 μm, for example.

At the time of irradiation with the second laser 85, a metal mask (not shown) is placed on the surface protective film 83. The metal mask has a slit that passes through the metal mask in the thickness direction z and extends in the second direction y. The slit has a length of 8 μm in the first direction x and a length of 50 μm in the second direction y, for example. In the second removal step, the metal mask is placed such that the two ends of the band-shaped opening in the second direction y are within the first circular region 84A and the second circular region 84B, and then, the band-shaped opening is irradiated with the second laser 85. Thereafter, the metal mask is moved in the first direction x. At this time, the metal mask is moved such that two adjacent band-shaped openings overlap with each other in the first direction x. By repeating the above-described operation, the series of band-shaped openings continuous with each other in the first direction x are irradiated with the second laser 85. That is, the series of band-shaped openings continuous with each other in the first direction x correspond to the band-shaped region 85A. As shown in FIG. 17, the dimension L2 of irradiation with the second laser 85 in the second direction y is slightly smaller (about 44 µm) than the width of the band-shaped region 85A. Accordingly, the dimension L1 of irradiation with the first laser 84 in the second direction y is smaller than the dimension L2. The output of the second laser 85 is 3 W, for example. Thus, the output of the first laser 84 is smaller than that of the second laser 85.

In the second removal step, the second laser 85 passes through the passivation film 82 and the surface protective film 83 and melts the element continuous body 81. As a result, a groove 86 is formed in the element continuous body 81 while dividing the test electrodes 32. At this time, the vapor pressure of the melted element continuous body 81 rises, thereby causing portions of the passivation film 82 and surface protective film 83 overlapping with the groove 86 as viewed along the thickness direction z to burst. A portion of the remaining portions of the dents 813 corresponds to the dents 13 of the semiconductor element A10. In addition, a portion of the remaining portions of the penetrating portions 821 corresponds to the recesses 211 of the semiconductor element A10. The first side surface 10C and the intermediate surface 10E of the element body 10 of the semiconductor element A10 are formed by a portion of the remaining portion of the groove 86.

The grooves 86 that extend in the second direction y also can be formed by the above-described first removal step and second removal step.

Figure 18:
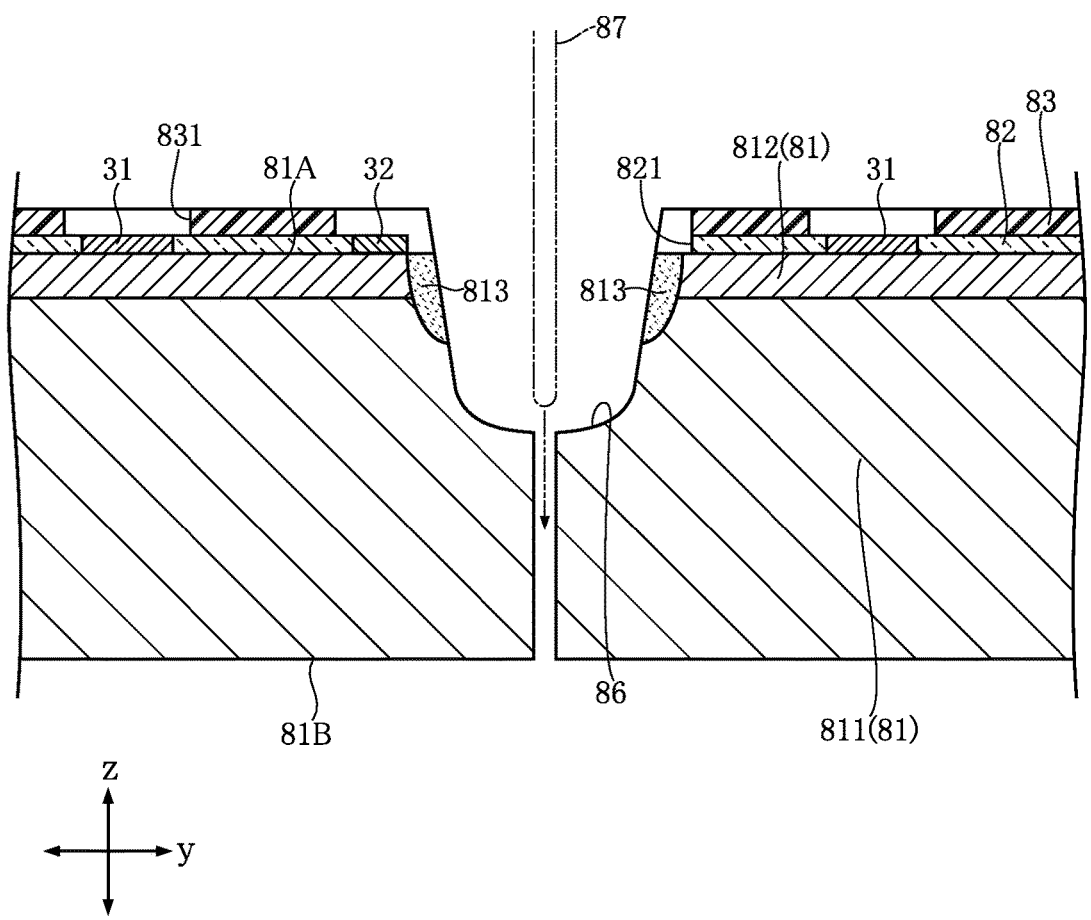
FIG. 18 is a cross-sectional view for illustrating the production process of the semiconductor element shown in FIG. 1.

Finally, as shown in FIG. 18, the element continuous body 81 is cut along the first direction x by inserting a dicing blade 87 in the thickness direction z into the plurality of grooves 86 that extend in the first direction x. In this step, the element continuous body 81 is also cut along the second direction y by inserting the dicing blade in the thickness direction z into the plurality of grooves 86 that extend in the second direction y. As a result, the element continuous body 81 is divided into a plurality of individual pieces. The second side surface 10D of the element body 10 of the semiconductor element A10 is a cut surface obtained through cutting with the dicing blade 87.

Next, actions and effects of the semiconductor element A10 and the method for producing the semiconductor element A10 will be described.

The semiconductor element 10A includes the element body 10 that has the principal surface 10A and the first side surface 10C connected to the principal surface 10A. The element body 10 is provided with the plurality of dents that straddle the boundary 10F between the principal surface 10A and the first side surface 10C and are recessed from both the principal surface 10A and the first side surface 10C. The dents 13 are arranged along the boundary 10F. The dents 13 are portions of the traces of the dents 813 formed in the element continuous body 81 by the first laser 84 in the first removal step for forming the grooves 86 in the production of the semiconductor element A10. With this configuration, the concentration of the thermal effect of the first laser 84 on the element body 10 is alleviated, whereby the reduction in bending strength of the semiconductor element A10 can be suppressed.

Moreover, in the second removal step for forming the grooves 86 in the production of the semiconductor element A10, the dents 13 (dents 813) act as perforations when removing portions of the element continuous body 81 and test electrodes 32 using the second laser 85. This allows the output of the second laser 85 to be reduced, whereby the concentration of the thermal effect of the second laser 85 on the element body 10 can be alleviated. In addition, the test electrodes 32 can be reliably divided by the second laser 85 without chipping the element body 10. Accordingly, the semiconductor element A10 enables suppressing a reduction in bending strength of the semiconductor element A10 while avoiding damage caused by dividing the test electrodes 32.

The semiconductor element A10 includes the passivation film 21 that covers the principal surface 10A of the element body 10. The passivation film 21 is provided with the plurality of recesses 211 that are recessed inwardly from the outer edge of the passivation film 21 and pass through the passivation film 21 in the thickness direction z. As viewed along the thickness direction z, the recesses 211 and the dents 13 overlap with each other in one-to-one correspondence. The recesses 211 are portions of the traces of the penetrating portions 821 formed in the passivation film 82 by the first laser 84 in the first removal step for forming the grooves 86 in the production of the semiconductor element A10. With this configuration, the recesses 211 are adjacent to the dents 13, and accordingly, the passivation film 21 is provided in a region where it is required in the semiconductor element A10. Furthermore, it is preferable that, as viewed along the thickness direction z, the recesses 211 enclose the dents 13 in one-to-one correspondence. With this configuration, the recesses 211 are more closely adjacent to the dents 13.

The element body 10 has the second side surface 10D connected to the rear surface 10B. As viewed along the thickness direction z, the second side surface 10D includes the regions located outward of the first side surface 10C. The second side surface 10D is a cut surface that appears in the step of cutting the element continuous body 81 by inserting the dicing blade 87 in the thickness direction z into the grooves 86 in the production of the semiconductor element A10. Thus, the element continuous body 81 is cut without bringing the dicing blade 87 into contact with the test electrodes 32.

The cross-sectional area of each dent 13 along the directions orthogonal to the thickness direction z decreases gradually from the principal surface 10A toward the rear surface 10B of the element body 10. With this configuration, the concentration of the thermal effect on the element body during the formation of the dents 13 is further alleviated.

The dents 13 extend to the inside of the semiconductor substrate 11 of the element body 10. With this configuration, in the second removal step for forming the grooves 86 in the production of the semiconductor element A10, the output of the second laser 85 can be further reduced.

The method for producing the semiconductor element A10 includes the step of forming the grooves 86 in the element continuous body 81 while dividing the test electrodes 32 and the step of cutting the element continuous body 81 by inserting the dicing blade 87 in the thickness direction z into the grooves 86. According to this method, the dicing blade 87 does not come into contact with the test electrodes 32 at the time of cutting the element continuous body 81 with the dicing blade 87, and thus chipping of the element body 10 of the semiconductor element A10 can be prevented.

The step of forming the grooves 86 in the production of the semiconductor element A10 includes the first removal step and the second removal step. In the first removal step, the first circular regions 84A and the second circular regions 84B are each irradiated with the first laser 84. In the second removal step, the band-shaped region 85A is irradiated with the second laser 85. By adopting these steps, the test electrodes 32 can be reliably divided while alleviating the concentration of the thermal effect on the element body 10 of the semiconductor element A10.

The output of the first laser 84 is smaller than that of the second laser 85. With this configuration, it is possible to suppress the thermal effect on the functional layer 12 included in the element body 10 of the semiconductor element A10. In the first removal step for forming the grooves 86, the first circular regions 84A are all equal in size, and the second circular regions 84B are all equal in size. With this configuration, it is possible to prevent the thermal effect of the first laser 84 from being unevenly concentrated on the element body 10.

A semiconductor element A20 according to the second embodiment of the present disclosure will be described with reference to FIGS. 19 to 23. In these drawings, components that are identical or similar to those of the above-described semiconductor element A10 are given the same reference signs, and redundant explanations thereof are omitted.

The semiconductor element A20 is different from the above-described semiconductor element A10 in the structure of an element body 10 and the structure of a plurality of dents 13.

Figure 19:
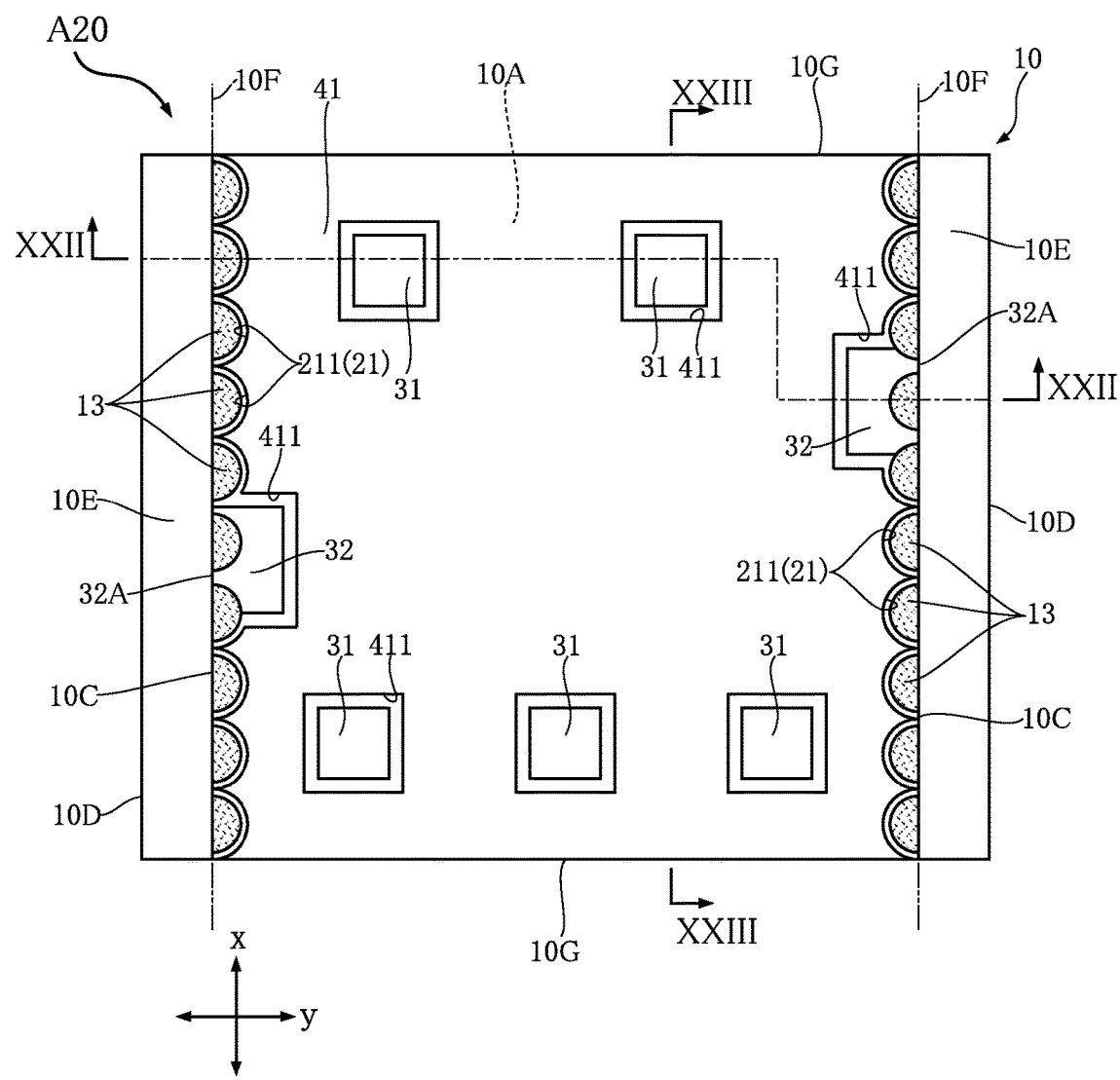
FIG. 19 is a plan view of a semiconductor element according to a second embodiment of the present disclosure.
Figure 21:
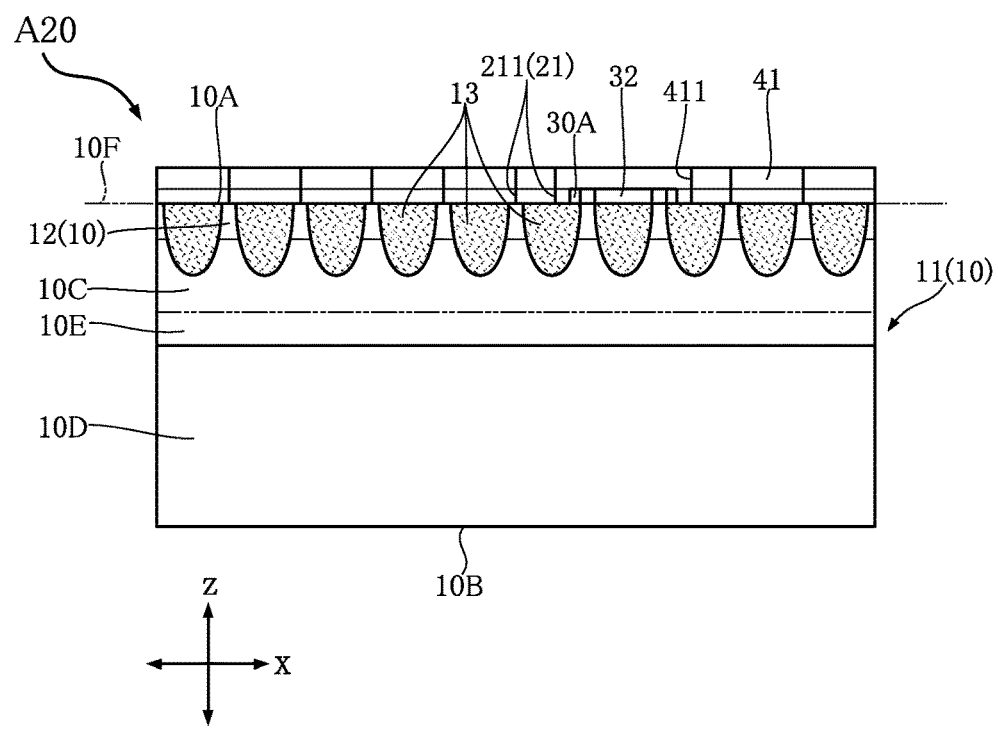
FIG. 21 is a right side view of the semiconductor element shown in FIG. 19.
Figure 22:
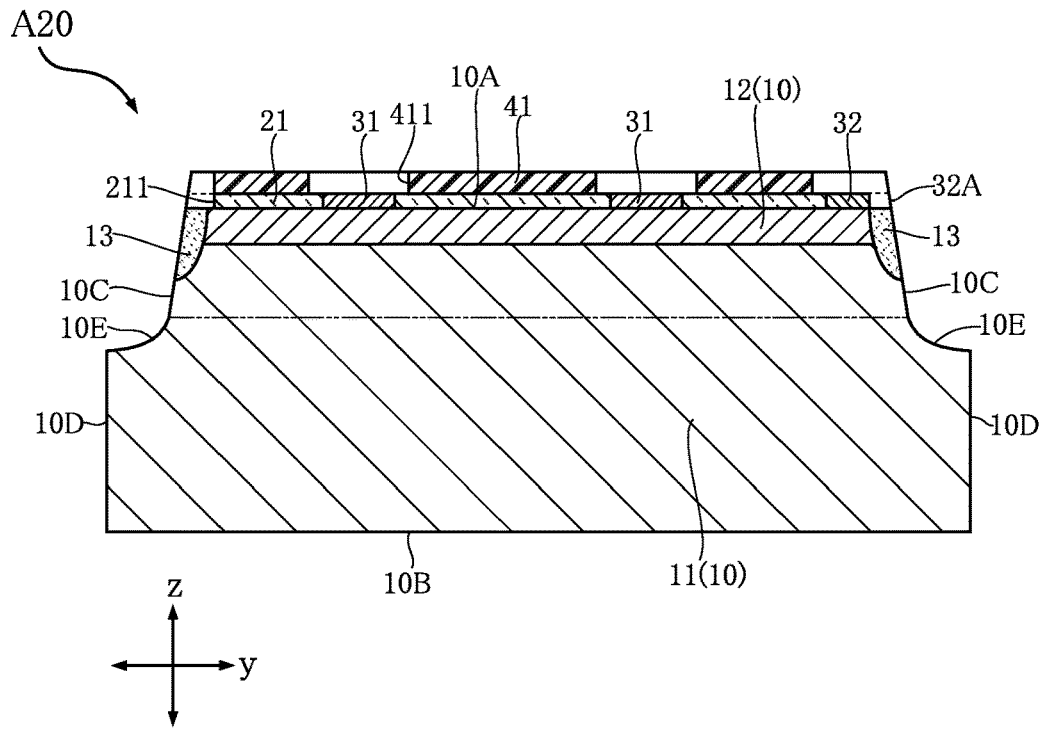
FIG. 22 is a cross-sectional view taken along line XXII-XXII in FIG. 19.

As shown in FIGS. 19, 21, and 22, first side surfaces 10C of the element body 10 include only a pair of regions facing in the second direction y. Second side surfaces 10D of the element body 10 include only a pair of regions facing in the second direction y. As viewed along the thickness direction z, the pair of regions of the second side surfaces 10D are located outward of the pair of regions of the first side surfaces 10C. Intermediate surfaces 10E of the element body 10 are connected to the pair of regions of the first side surfaces 10C and the pair of regions of the second side surfaces 10D, respectively. Thus, as shown in FIG. 19, the semiconductor element A20 includes the pairs of regions, each of which are spaced apart from each other in a direction orthogonal to the thickness direction z (the second direction y) as viewed along the thickness direction z.

Figure 20:
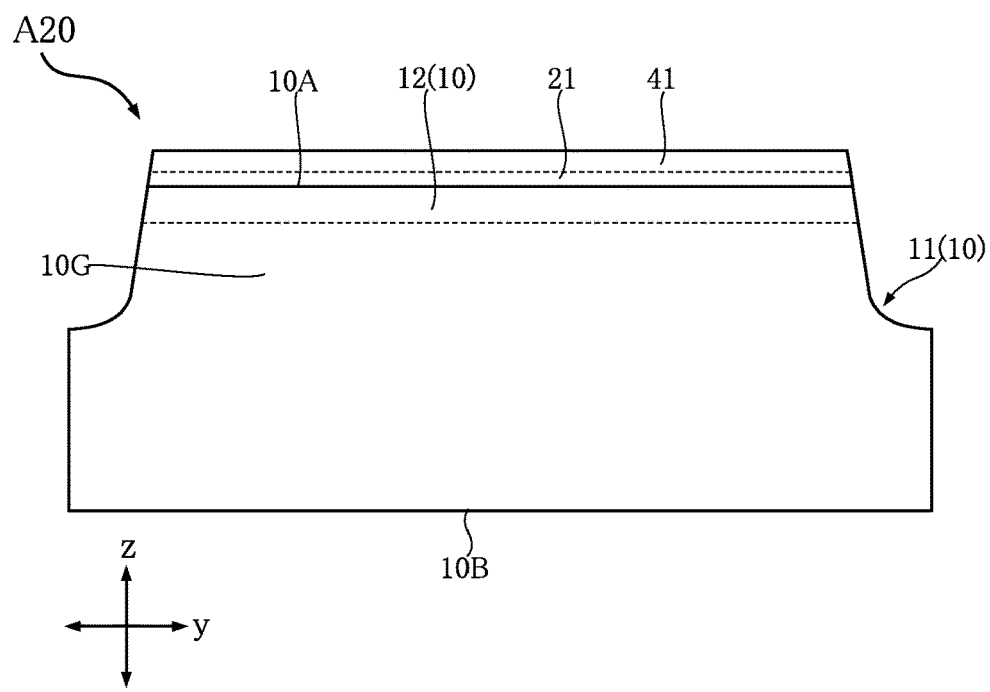
FIG. 20 is a front view of the semiconductor element shown in FIG. 19.
Figure 23:
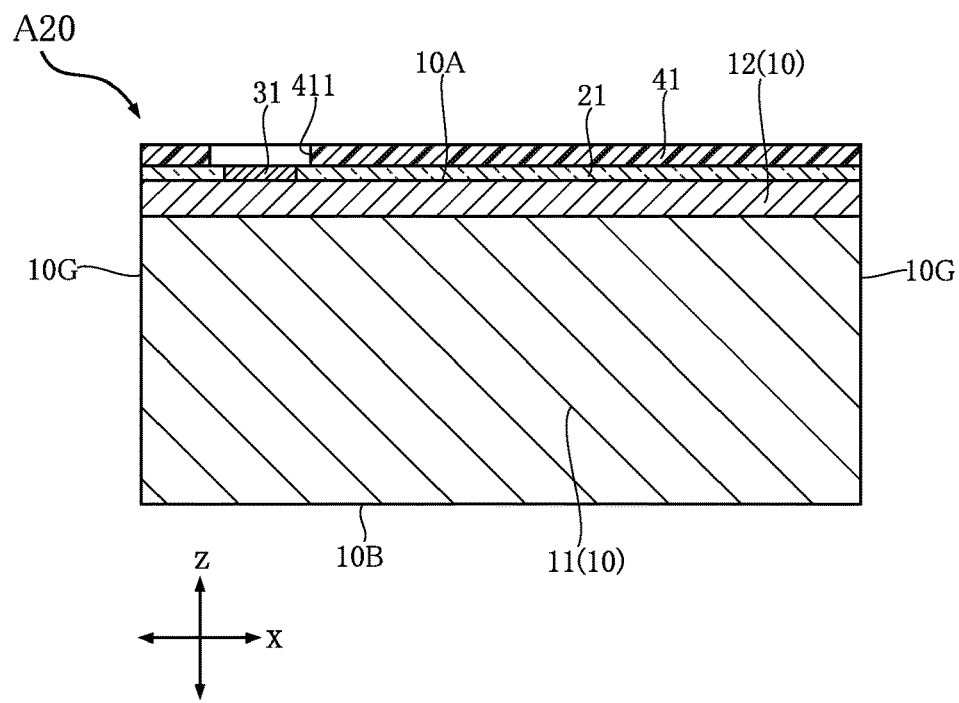
FIG. 23 is a cross-sectional view taken along line XXIII-XXIII in FIG. 19.

As shown in FIGS. 19, 20, and 23, the element body 10 has third side surfaces 10G. The third side surfaces 10G are connected to both a principal surface 10A and a rear surface 10B. The third side surfaces 10G include a pair of regions facing in the first direction x. The respective regions of the third side surfaces 10G are connected, at both ends thereof in the second direction y, to the pair of regions of the first side surfaces 10C, the pair of regions of the second side surfaces 10D, and the pair of regions of the intermediate surfaces 10E, respectively.

As shown in FIGS. 19 and 21, the dents 13 straddle the boundaries 10F between the principal surface 10A of the element body 10 and the pair of regions of the first side surfaces 10C. In the semiconductor element A20, the dents 13 are arranged along the two boundaries 10F spaced apart from each other in the second direction y.

In the method for producing the semiconductor element A20, a plurality of grooves 86 that extend in the first direction x are formed in the element continuous body 81, whereas a plurality of grooves 86 that extend in the second direction y are not formed in the element continuous body 81. Thus, at the time of dividing the element continuous body 81 into a plurality of individual pieces, the element continuous body 81 is cut along the first direction x by inserting a dicing blade 87 into the grooves 86, whereas the element continuous body 81 is cut along the second direction y by bringing the dicing blade 87 into direct contact with the element continuous body 81. This is because, in the semiconductor element A20, test electrodes 32 are not adjacent to the boundaries between the principal surface 10A and the third side surfaces 10G of the element body 10. Thus, the third side surfaces 10G of the element body 10 of the semiconductor element A20 are also cut surfaces obtained through cutting with the dicing blade 87, similarly to the second side surfaces 10D.

Next, actions and effects of the semiconductor element A20 will be described.

The semiconductor element A20 includes the element body 10 that has the principal surface 10A and the first side surfaces 10C connected to the principal surface 10A. The element body 10 is provided with the plurality of dents 13 that straddle the boundaries 10F between the principal surface 10A and the first side surfaces 10C and are recessed from both the principal surface 10A and the first side surfaces 10C. The dents 13 are arranged along the boundaries 10F. Accordingly, the semiconductor element A20 also enables suppressing a reduction in bending strength of the semiconductor element A20 while avoiding damage caused by dividing the test electrodes 32.

The present disclosure is not limited to the above-described embodiments. Various modifications in design may be made freely in the specific structure of each part of the present disclosure.

The invention claimed is:

1. A semiconductor element comprising:
   an element body that has a principal surface facing in a thickness direction and a first side surface facing in a direction orthogonal to the principal surface and connected to the principal surface; and
   a test electrode that is disposed on the principal surface and is adjacent to a boundary between the principal surface and the first side surface,
   wherein the element body is provided with a plurality of dents that straddle the boundary and are recessed from both the principal surface and the first side surface, and the plurality of dents are arranged along the boundary.

2. The semiconductor element according to claim 1, further comprising a passivation film that covers the principal surface,
   wherein the passivation film is provided with a plurality of recesses that are recessed inwardly from an outer edge of the passivation film and pass through the passivation film in the thickness direction, and
   as viewed along the thickness direction, the plurality of recesses overlap with the plurality of dents, respectively.

3. The semiconductor element according to claim 2,
   wherein, as viewed along the thickness direction, the plurality of recesses enclose the plurality of dents, respectively.

4. The semiconductor element according to claim 2,
   wherein the element body has a rear surface facing away from the principal surface and a second side surface facing in a direction orthogonal to the rear surface and connected to the rear surface, and
   as viewed along the thickness direction, the second side surface includes regions located outward of the first side surface.

5. The semiconductor element according to claim 4,
   wherein the element body has an intermediate surface connected to the first side surface and the second side surface, and
   as viewed along the thickness direction, the intermediate surface has a frame shape.

6. The semiconductor element according to claim 4,
wherein the element body has an intermediate surface connected to the first side surface and the second side surface, and
as viewed along the thickness direction, the intermediate surface includes a pair of regions that are spaced apart from each other in a direction orthogonal to the thickness direction.

7. The semiconductor element according to claim 6,
wherein the intermediate surface is a rough surface.

8. The semiconductor element according to claim 7,
wherein the intermediate surface is recessed inwardly of the semiconductor element.

9. The semiconductor element according to claim 5,
wherein a cross-sectional area of each of the dents along directions orthogonal to the thickness direction decreases gradually from the principal surface toward the rear surface.

10. The semiconductor element according to claim 5,
wherein each of the dents has a fragment of the element body adhering thereto.

11. The semiconductor element according to claim 5,
wherein the test electrode has an end surface facing in a direction orthogonal to the thickness direction and also facing toward the outside of the element body, and
the end surface is exposed.

12. The semiconductor element according to claim 5,
wherein the element body includes: a semiconductor substrate that has the rear surface; and a functional layer that has the principal surface and is laminated on the semiconductor substrate,
the test electrode is electrically connected to the function layer, and
the semiconductor substrate and the functional layer each have a portion of the first side surface.

13. The semiconductor element according to claim 12,
wherein the plurality of dents extend to an inside of the semiconductor substrate.

14. The semiconductor element according to claim 12,
further comprising a plurality of electrodes and a surface protective film,
wherein the plurality of electrodes are disposed on the principal surface, surrounded by the passivation film, and electrically connected to the functional layer, and
the surface protective film covers the passivation film and is located about the plurality of electrodes.

15. A method for producing a semiconductor element, the method comprising:

a step of forming a test electrode on an element continuous body that has a principal surface facing in a thickness direction;
a step of forming a groove that is recessed from the principal surface in the thickness direction and extends in a first direction orthogonal to the thickness direction in the element continuous body while dividing the test electrode; and
a step of cutting the element continuous body along the first direction by inserting a dicing blade in the thickness direction into the groove,
wherein the step of forming the groove includes:
a first removal step of irradiating each of a plurality of first circular regions and each of a plurality of second circular regions with a first laser to remove portions of the element continuous body and the test electrodes falling within the first circular regions and the second circular regions, the first circular regions being arranged at predetermined intervals in the first direction and the second circular regions being arranged at the predetermined intervals in the first direction and spaced apart from the first circular regions in a second direction orthogonal to both the thickness direction and the first direction as viewed along the thickness direction; and
a second removal step of irradiating a band-shaped region with a second laser to remove portions of the element continuous body and the test electrodes falling within the band-shaped region, the band-shaped region extending in the first direction and being continuous with both the first circular regions and the second circular regions as viewed along the thickness direction.

16. The method according to claim 15,
wherein a dimension of irradiation with the first laser in the second direction is smaller than a dimension of irradiation with the second laser in the second direction.

17. The method according to claim 16,
wherein an output of the first laser is smaller than an output of the second laser.

18. The method according to claim 17,
wherein the plurality of first circular regions are all equal in size, and the plurality of second circular regions are all equal in size.

* * * * *